United States Patent [19]

Longwell et al.

[11] Patent Number: 5,099,196
[45] Date of Patent: Mar. 24, 1992

[54] ON-CHIP INTEGRATED CIRCUIT SPEED SELECTION

[75] Inventors: Michael L. Longwell, Austin; Terry J. Parks, Round Rock, both of Tex.

[73] Assignee: Dell USA Corporation, Austin, Tex.

[21] Appl. No.: 615,732

[22] Filed: Nov. 9, 1990

[51] Int. Cl.[5] ...................... G01R 15/12; G06F 11/00
[52] U.S. Cl. ............................... 324/158 R; 371/16.1; 371/25.1; 324/73.1
[58] Field of Search .............. 324/73.1, 158 R, 158 T; 371/15.1, 22.5, 22.6, 24, 25.1, 16.1; 368/118, 120

[56] References Cited

U.S. PATENT DOCUMENTS

| | | | |
|---|---|---|---|
| 4,092,589 | 5/1978 | Chau et al. | 371/1 |
| 4,468,768 | 8/1984 | Sunkle et al. | 371/16.1 |
| 4,727,549 | 2/1988 | Tulpule et al. | 371/25.1 |
| 4,866,713 | 9/1989 | Worger et al. | 371/25.1 |
| 4,893,072 | 1/1990 | Matsumoto | 371/25.1 |

*Primary Examiner*—Kenneth A. Wieder
*Assistant Examiner*—Vinh P. Nguyen
*Attorney, Agent, or Firm*—Thomas G. Devine

[57] ABSTRACT

An electronic circuit for the detection of required operational speed of one or more integrated circuit semiconductor chips is used in conjunction with an off-the-shelf integrated circuit tester. The tester provides timing, control and a display. Each of the integrated circuit semiconductor chips is provided with a ring oscillator circuit for generating a series of pulses, timed by the tester for a fixed period of time. A counter, formed in each of the semiconductor chips counts the number of pulses generated during the fixed period of time. A number, generated in the tester, indicative of a required speed of operation is set in a latch assembly that is formed in each of the semiconductor chips. A comparator, also formed in each of the semiconductor chips, compares the contents of the latch with the contents of the counter and if the contents of the counter is equal to or larger than the contents of the latch, the tested semiconductor chip is acceptable. A display in the tester indicates the result. If the speed of operation is very high, then the number indicative of a required speed of operation is divided by, for example, two. The output of the oscillator is also divided by two so that the size of the counter and the latch is not exceeded.

14 Claims, 4 Drawing Sheets

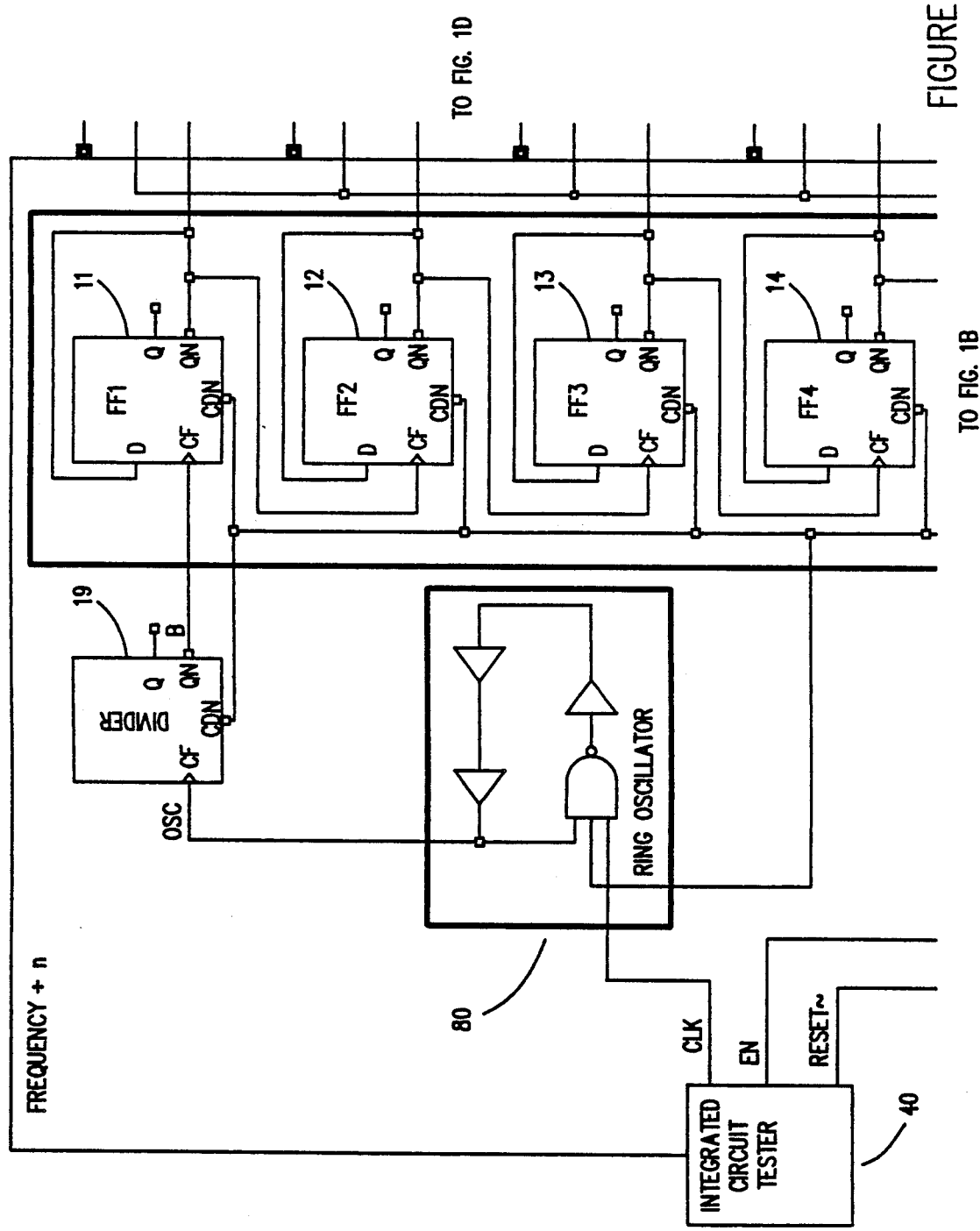

ON-CHIP INTEGRATED CIRCUIT SPEED SELECTION

BACKGROUND OF THE INVENTION

This invention pertains to testing for operational speed of integrated circuit semiconductor chips. More particularly it pertains to such testing in conjunction with an off-the-shelf integrated circuit tester.

Description of the Related Art

Process variation for integrated circuit semiconductor chips is large. High performance chips are often speed sorted in the test flow, using a very expensive, customized integrated circuit tester. Fast chips are used to build fast systems which command a higher price in the marketplace.

State of the art integrated circuit semiconductor chips are tested functionally at low speed. If they pass, they proceed to higher speed test. The speed of the test prior to failure is the speed of a chip. Again, a customized integrated circuit tester is used.

Application Specific Integrated Circuit (ASIC) semiconductor chips are rarely selected for speed. ASIC chips are not generally state of the art. The very large variety of circuits manufactured precludes the use of customized testers due to the tester cost and downtime.

Ring oscillators have been integrated for use with very expensive testers which have been customized with frequency counters.

This invention uses standard testers and allows the ASIC or other integrated circuit semiconductor chips to be tested for operational speed.

BRIEF SUMMARY OF THE INVENTION

A ring oscillator, frequency counter, latch and comparator are designed into an integrated circuit semiconductor chip to provide an easy mechanism for speed selection of chips based on process variation. The speed of the oscillator is representative of the speed of other components in the chip.

This invention enables selection by speed of operation without need for a customized special integrated circuit tester. In this invention, the tester is used to provide timing, a visual indication, entry of a desired speed of operation, and various control signals.

A number, indicative of the desired speed (divided by two in this preferred embodiment) is entered into the latch through the tester. The oscillator is started by a CLK signal from the tester, and for a given period of time (timed by the tester) the pulses generated by the oscillator are counted by the counter. In this preferred embodiment, the pulses from the oscillator are divided by two in frequency. If the number of oscillator pulses counted is equal to or greater than the number set into the latch, the chip has a satisfactory operational speed. If not, the chip may be appropriate for operation at some lower operational speed application.

The principal object of this invention is to provide a system for determining the operational speed of an integrated circuit semiconductor chip in conjunction with an off-the-shelf integrated circuit tester.

Another object of this invention is to provide an integrated circuit semiconductor chip with an oscillator, a counter, a latch and a comparator for determining its operational speed by using an off-the-shelf tester for timing, display and control.

These and other objects will be made clear in the detailed description that follows.

BRIEF DESCRIPTION OF THE DRAWING

FIGS. 1a-1d are a schematic diagram of the integrated components formed in the semiconductor chip required in this invention.

DETAILED DESCRIPTION OF THE INVENTION

Figure 1A:
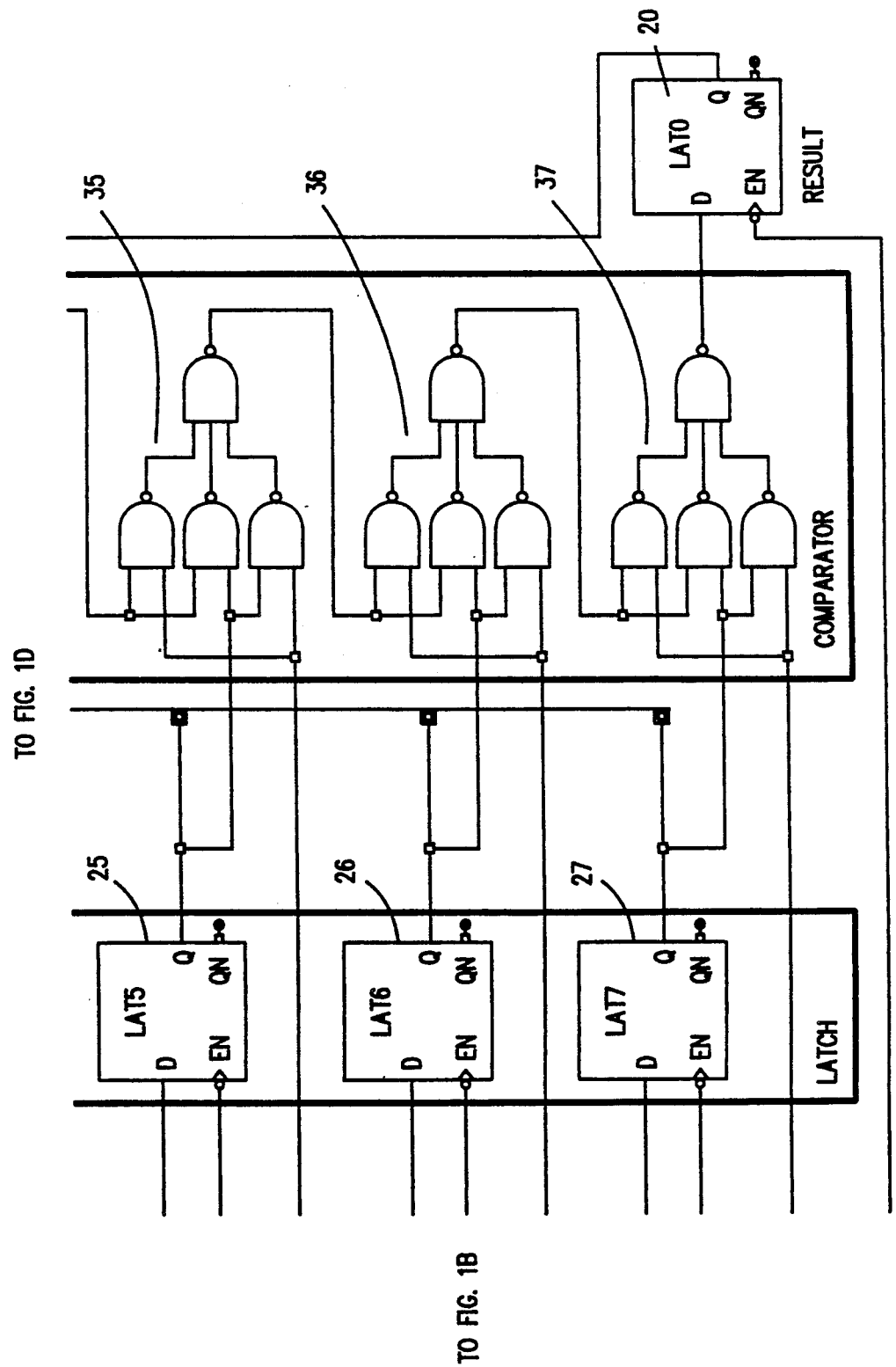
Figure 1B:
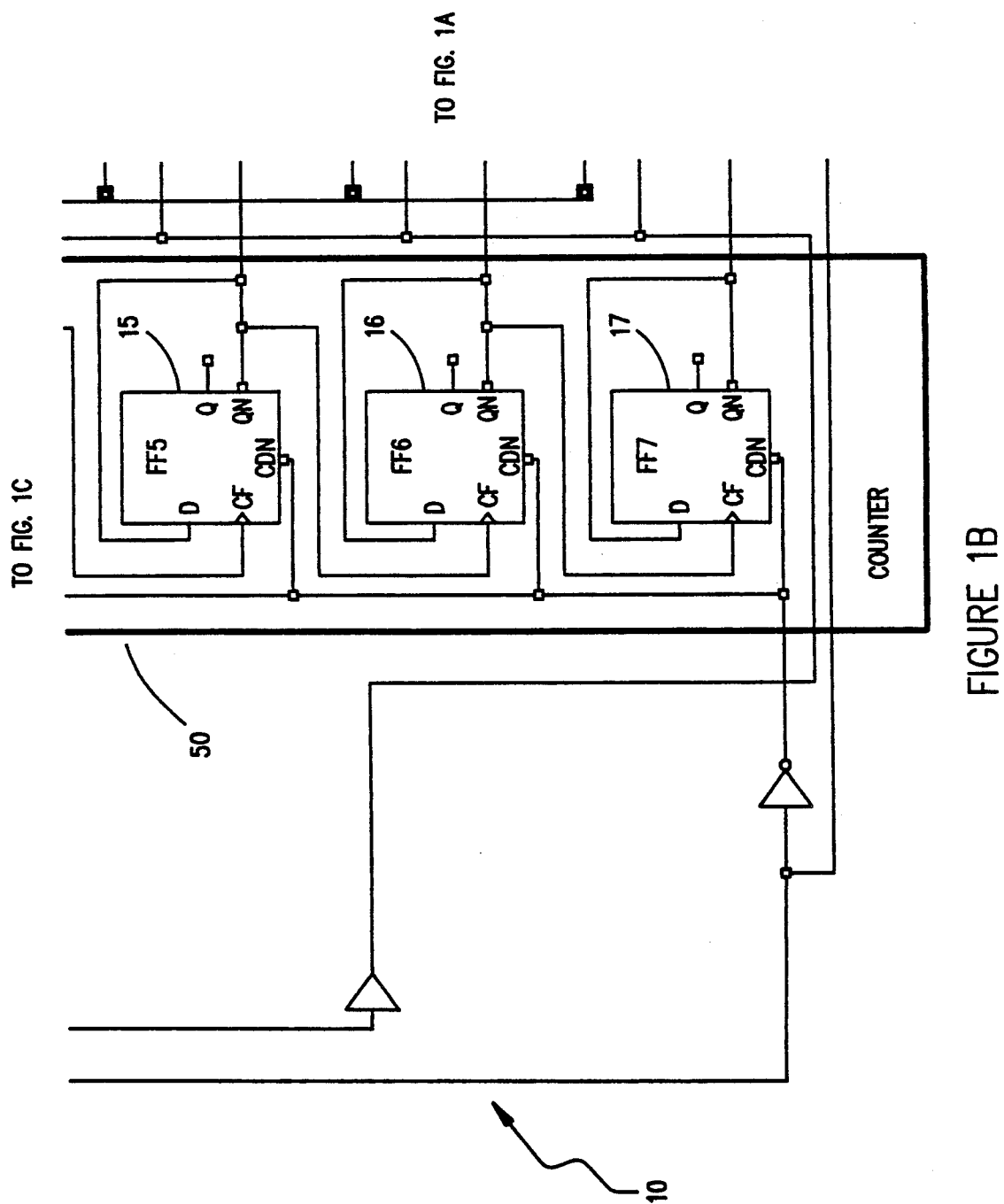
Figure 1D:
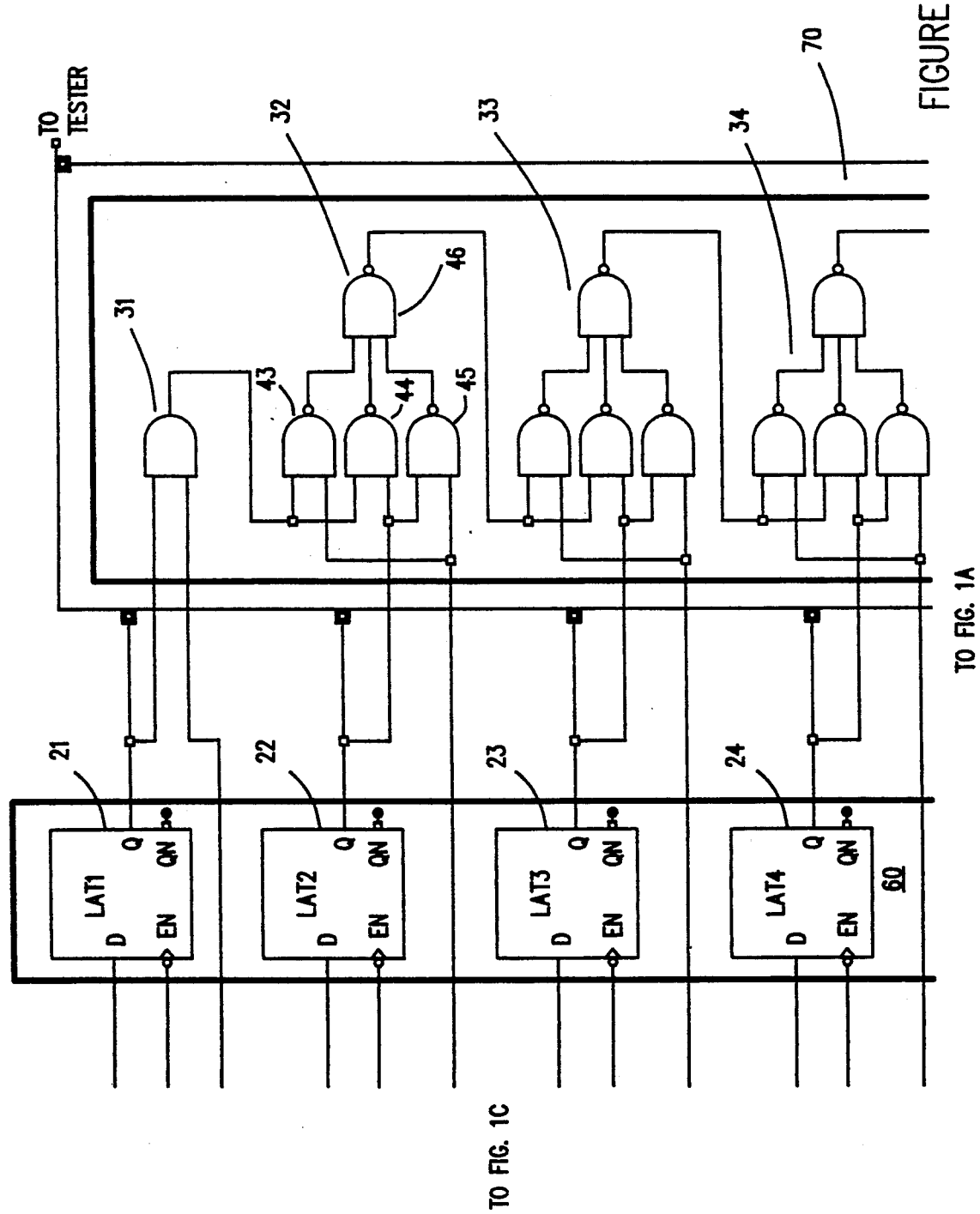

By forming an oscillator (a ring oscillator in this preferred embodiment) in an integrated circuit semiconductor chip to generate pulses, representative of the speed of other components formed in the chip, the operational speed of the ring oscillator and therefore that of the other components formed in the semiconductor chip can be determined. By further forming a counter, a latch assembly and a comparator assembly in the semiconductor chip, an off-the-shelf tester for supplying timing, display and control can be used to determine the operational speed of the integrated circuit semiconductor chip.

In the figure, integrated circuit tester 40 is shown providing the signals CLK, EN and RESET~. Also, the desired frequency number (divided by two in this preferred embodiment) is entered through the tester 40. Tester 40 has connections to each pin of the chip, for sending control signals and data to the chip, and receiving information from the chip. Speed cannot be tested, and one pin is selected to indicate whether the speed of the tested chip is equal to or greater than a minimum speed, as determined by the circuitry of this invention. Timing of signals and parameter such as the required speed of operation are entered as directed by the software of the tester, in a well known manner.

The tester used in this invention is a Hewlett-Packard HP82000 IC Evaluation System, Model D50. This tester is described in the following documents which are incorporated herein by reference:

(1) "Specifications for models D200 and D50".
(2) "Documentation Road Map"—copyright 1989.
(3) "Using the HP82000" rev. 1.1 December 1989.
(4) "Getting Started with the HP82000" rev. 1, June 1989.
(5) "Advanced Testing with the HP82000" rev. 1, July 1989.

Of course, a selection of another integrated circuit tester could be made as well.

Counter 50 is made up of individual stages 11-17 connected as shown with the carry from one stage applied as the input to the next stage. The counter is cleared by negating the signal RESET~ from tester 40. The counter is enabled by asserting signal RESET~.

Ring oscillator 80 is enabled while signal CLK, from tester 40 is high. Divider 19 divides the ring oscillator frequency to make it a usable number. In this preferred embodiment, divider 19 divides by two.

Latch assembly 60 is made up of individual latches, 21-27 for latching the frequency number entered through tester 40 (divided by two in this preferred embodiment). The frequency number is applied to the D inputs of each of latches 21-27, as shown. Each of latches 21-27 is enabled by signal EN from tester 40.

Comparator assembly 70 is made up of individual comparator stages 31-37, to compare each stage of the counter with each individual latch. With the exception of stage 31, which is a simple AND gate, the comparator stages are identical to comparator stage 32. For ease of understanding, only stage 32 will be described.

NAND gate 43 receives the output from comparator AND gate 31, as does NAND gate 44. The other input to NAND gate 43 comes from the output of counter 12 and the other input to NAND gate 44 comes from the output of latch 22. NAND gate 45 receives the output from latch 22 and from counter stage 12. NAND gates 43, 44 and 45 all provide inputs to NAND gate 46 whose output serves as an input to comparator stage 33. Comparator stage 33 provides an input to comparator stage 34, and so on.

Finally, a result latch 20 is provided to receive the final output from comparator stage 37 indicating whether the contents of the counter 50 are equal to or greater than the contents of latch 60. The output from latch 20, together with the output from latches 21-27 are sent to the tester where an indication is made of whether the oscillator frequency (divided by two) is greater than or equal to the operational frequency desired (divided by two). Sending the contents of latches 21-27 is a convenience, and is not required.

MODE OF OPERATION OF THE INVENTION

The minimum operational frequency is entered through the tester 40 into latches 21-27. In this preferred embodiment, to limit the number of latches required, this number is divided by two. The counter 50 is then reset by negating signal RESET~ from tester 40. The number (frequency divided by N) through tester 40 is then entered into the individual latches 21-27.

Counter 50 is enabled by the assertion of signal RESET~ and ring oscillator 80 is activated by signal CLK being asserted. The tester then holds signal CLK high for 1,000 ns. When signal CLK goes low, ring oscillator 80 stops oscillating. For ring oscillator 80 to oscillate, signal RESET~ must remain asserted. The timing period of 1000 ns is arbitrary and obviously a different time could be used.

Signal EN from tester 40 enables the output of latches 21-27 to be output to comparator 70 along with the output from counters 11-17. The comparison is made with the result being sent from comparator stage 37 to result latch 20. Result latch 20, with a high output, indicates that the oscillator frequency is equal to or greater than the frequency number set into latches 21-27.

The output from latch 20, together with the outputs from latches 21-27 are sent to the tester to be read as a register.

The above test describes the manner in which an integrated circuit semiconductor chip can be tested for operational speed in conjunction with an off-the-shelf integrated circuit tester. The particular type of tester, the number of stages in the counter, latch assembly and comparator are engineering choices, all contemplated within the scope of this invention which is limited only by the appended claims.

What is claimed is:

1. An electronic circuit for the detection of required operational speed of one or more integrated circuit semiconductor chips, in conjunction with an integrated circuit tester for providing timing, display, and control signal CLK, comprising:

(a) an oscillator circuit, formed in each of the one or more semiconductor chips, for generating a series of pulses, timed by the tester, connected to time the oscillator for a fixed period of time;

(b) a counter, connected to the oscillator and formed in each of the one or more semiconductor chips, for counting the number of pulses generated during the fixed period of time provided by the tester;

(c) a store, formed in each of the one or more semiconductor chips, for holding a number indicative of a required speed of operation; and (d) a comparator, formed in each of the one or more semiconductor chips, for comparing the number indicative of a required speed of operation from the store with the number of pulses counted during the fixed period of time output to the display for indicating whether the number of pulses counted is equal to or greater than the number indicative of a required speed of operation, thereby identifying a chip having the required speed of operation.

2. The circuit of claim 1 wherein the oscillator circuit comprises a ring oscillator.

3. The circuit of claim 2 wherein the counter comprises N stages.

4. The circuit of claim 3 wherein the store comprises latch means.

5. The circuit of claim 4 wherein the number indicative of a required speed is divided by a divisor before entry into the latch means, and further comprising a divider, for receiving the series of pulses from the ring oscillator counted during the fixed period of time and dividing by the divisor.

6. The circuit of claim 5 wherein the latch means comprises N latches.

7. The circuit of claim 6 wherein the comparator comprises N stages.

8. The circuit of claim 7 wherein N=7.

9. The circuit of claim 8 wherein the divisor=2.

10. The circuit of claim 9 wherein the oscillator is activated by the assertion of signal CLK, and is deactivated by the deassertion of signal CLK.

11. A method of detecting required operational speed of one or more integrated circuit semiconductor chips, employing a chip tester for providing test timing and for displaying results, comprising the steps of:

(a) forming an oscillator, counter, latch and comparator on each of the one or more integrated circuit semiconductor chips;

(b) entering a number indicative of a required speed of operation into the latch;

(c) starting the oscillator;

(d) counting the oscillator pulses during the test timing provided by the tester;

(e) comparing the number of counted oscillator pulses with the number indicative of a required speed of operation from the latch; and (f) accepting the chip when the number of counted oscillator pulses equals or is greater than the number indicative of a required speed of operation.

12. The method of claim 11 further comprising, after the step of comparing, the steps of: sending the result of comparing to the chip tester; and displaying the result.

13. The method of claim 12 further comprising the step, before the step of entering a number, of dividing the number indicative of a required speed of operation, and the step, after the step of starting the oscillator, of dividing the number of oscillator pulses by the same divisor as that used in dividing the number indicative of a required speed of operation.

14. The method of claim 13 wherein the divisor=2.

* * * * *